(12) United States Patent
Bozorg-Grayeli et al.

(10) Patent No.: US 11,935,799 B2
(45) Date of Patent: Mar. 19, 2024

(54) INTEGRATED CIRCUIT PACKAGE LIDS WITH POLYMER FEATURES

(71) Applicant: Intel Corporation, Santa Clara, CA (US)

(72) Inventors: Elah Bozorg-Grayeli, Chandler, AZ (US); Taylor William Gaines, Chandler, AZ (US); Frederick W. Atadana, Chandler, AZ (US); Sergio Antonio Chan Arguedas, Chandler, AZ (US); Robert F. Cheney, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 889 days.

(21) Appl. No.: 16/451,973

(22) Filed: Jun. 25, 2019

(65) Prior Publication Data
US 2020/0411395 A1    Dec. 31, 2020

(51) Int. Cl.
*H01L 23/06*     (2006.01)
*H01L 23/053*    (2006.01)
*H01L 23/498*    (2006.01)
*H01L 23/367*    (2006.01)
*H01L 23/42*     (2006.01)
*H01L 25/065*    (2023.01)

(52) U.S. Cl.
CPC ............ *H01L 23/06* (2013.01); *H01L 23/053* (2013.01); *H01L 23/49816* (2013.01); *H01L 23/3672* (2013.01); *H01L 23/42* (2013.01); *H01L 25/0655* (2013.01)

(58) Field of Classification Search
CPC .. H01L 23/06; H01L 23/053; H01L 23/49816
See application file for complete search history.

(56) References Cited

U.S. PATENT DOCUMENTS

| | | | | |
|---|---|---|---|---|
| 5,606,200 A * | 2/1997 | Haraguchi | ............. | H01L 23/24 257/788 |
| 5,940,271 A * | 8/1999 | Mertol | ............... | H01L 23/4093 165/185 |
| 6,117,705 A * | 9/2000 | Glenn | ................ | H01L 31/0203 438/106 |
| 6,392,429 B1 * | 5/2002 | Hembree | ................ | H01L 22/20 257/E23.07 |
| 6,472,598 B1 * | 10/2002 | Glenn | .................... | H01L 23/24 257/E23.114 |
| 7,109,410 B2 * | 9/2006 | Arnold | ............. | H01L 23/49822 361/752 |
| 7,268,428 B2 * | 9/2007 | Edwards | ............ | H01L 23/3675 257/E23.087 |
| 7,488,903 B2 * | 2/2009 | Kawagishi | ............ | H01L 25/165 174/385 |
| 8,178,956 B2 * | 5/2012 | Do | .......................... | H01L 24/97 257/676 |
| 8,552,539 B1 * | 10/2013 | Foster | .................... | H01L 21/52 257/659 |

(Continued)

*Primary Examiner* — Eugene Lee
(74) *Attorney, Agent, or Firm* — Akona IP PC

(57) ABSTRACT

Disclosed herein are integrated circuit (IC) package lids with polymer features, as well as related methods and devices. For example, in some embodiments, an IC package may include a package substrate, a lid, and a die between the package substrate and the lid. A foot or rib of the lid may include a polymer material.

18 Claims, 7 Drawing Sheets

(56) References Cited

U.S. PATENT DOCUMENTS

| | | | |
|---|---|---|---|
| 10,074,615 B1* | 9/2018 | Tseng | H01L 21/02008 |
| 10,470,325 B2* | 11/2019 | Wittmann | H05K 1/142 |
| 11,328,978 B2* | 5/2022 | Eid | H01L 23/42 |
| 2005/0280139 A1* | 12/2005 | Zhao | H01L 23/24 |
| | | | 257/E23.092 |
| 2015/0173227 A1* | 6/2015 | Ott | H05K 5/065 |
| | | | 29/829 |
| 2017/0069828 A1* | 3/2017 | Lee | H01L 23/552 |
| 2017/0263515 A1* | 9/2017 | Bolognia | H01L 23/053 |
| 2018/0166351 A1* | 6/2018 | Han | H01L 23/053 |
| 2018/0174984 A1* | 6/2018 | Hung | H01L 23/16 |
| 2018/0206355 A1* | 7/2018 | Wittmann | H05K 1/181 |
| 2019/0333867 A1* | 10/2019 | Tsai | H01L 23/3121 |
| 2019/0385989 A1* | 12/2019 | Yu | H01L 23/5386 |
| 2020/0211978 A1* | 7/2020 | Pei | H01L 23/3135 |
| 2022/0238411 A1* | 7/2022 | Eid | H01L 23/367 |

* cited by examiner

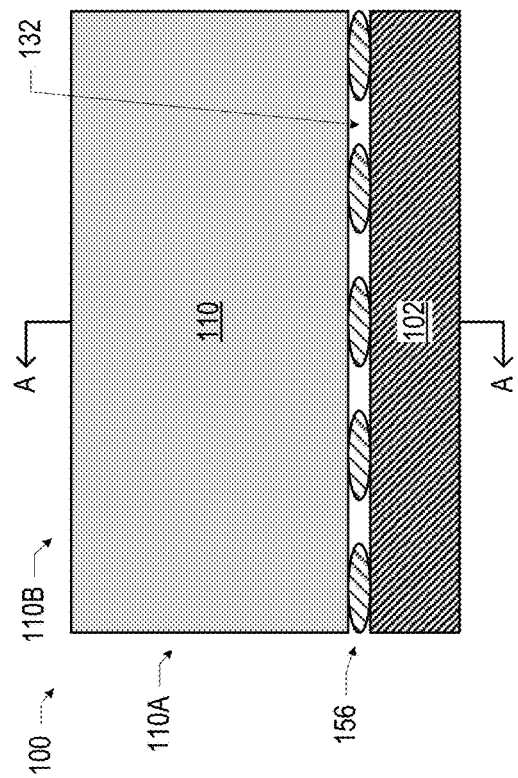
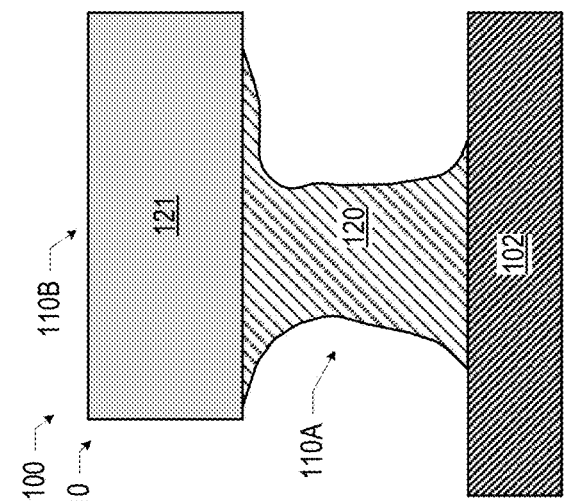
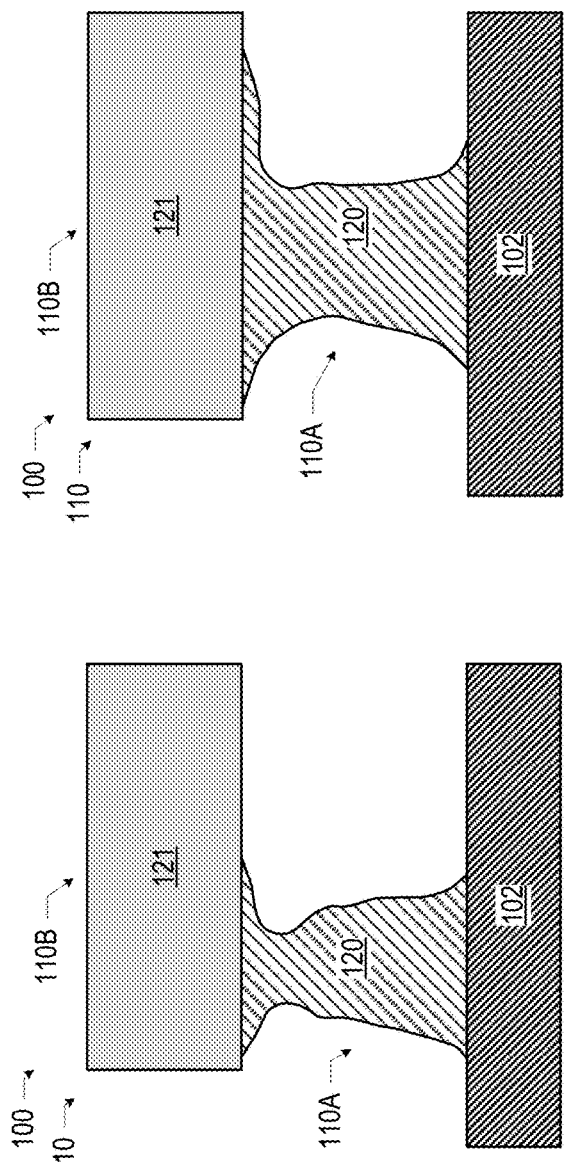

INTEGRATED CIRCUIT PACKAGE LIDS WITH POLYMER FEATURES

BACKGROUND

Many electronic devices generate significant amounts of heat during operation. Some such devices include heat sinks or other components to enable the transfer of heat away from heat-sensitive elements in these devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 3A-3B are side, cross-sectional views of an IC assembly that includes a lid having one or more polymer features, in accordance with various embodiments.

FIGS. 4A-4B are detailed views of portions of example IC packages with a lid having one or more polymer features, in accordance with various embodiments.

DETAILED DESCRIPTION

Figure 1:
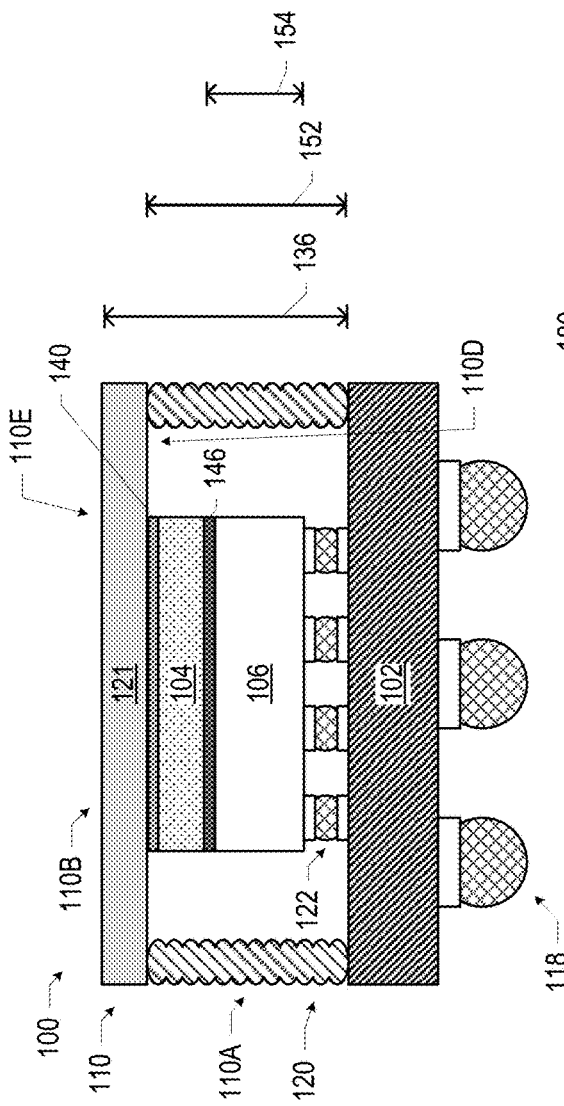
FIGS. 1-2 are side, cross-sectional views of example integrated circuit (IC) packages with lids having one or more polymer features, in accordance with various embodiments.

Disclosed herein are integrated circuit (IC) package lids with polymer features, as well as related methods and devices. For example, in some embodiments, an IC package may include a package substrate, a lid, and a die between the package substrate and the lid. A foot or rib of the lid may include a polymer material.

The IC packages 100 disclosed herein may utilize lids 110 with one or more polymer features (e.g., foot portions, rib portions, etc.). Forming features of a lid 110 with polymer materials may substantially simplify the manufacturing process for such lids 110 relative to conventional lids, and/or may enable greater control and flexibility over the geometry and material properties of these features. For example, conventional lids are typically stamped out of metal using several hundred tons of force, with greater force required for more complex features. Consequently, innovations in lid design have been accompanied by higher cost, lower throughput, and more difficult quality control. The lids 110 disclosed herein utilize polymers 120 to form some or all of the features that may previously have been stamped, thereby reducing the stamping tonnage required, increasing the throughput, reducing the cost, expanding the range of features that may be practically and economically manufactured, and improving the quality control relative to conventional lids.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 3" may be used to refer to the collection of drawings of FIGS. 3A-3B, the phrase "FIG. 4" may be used to refer to the collection of drawings of FIGS. 4A-4B, etc.

Figure 2:
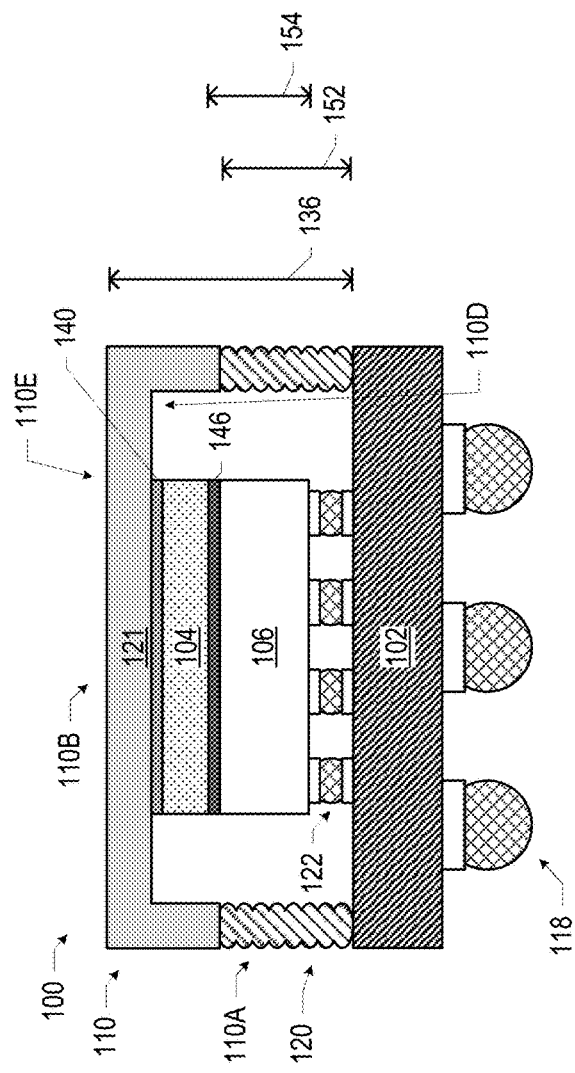

FIG. 1 is a side, cross-sectional view of an example IC package 100 with a lid 110 that includes a polymer 120. The IC package 100 of FIG. 1 includes certain components arranged in a particular manner, but this is simply illustrative, and an IC package 100 in accordance with the present disclosure may take any of a number of forms. FIGS. 2-4, discussed further below, illustrate other examples of IC packages 100 in accordance with the present disclosure; any of the elements discussed herein with reference to FIG. 1 may take any of the forms of those elements discussed herein with reference to FIGS. 2-4, and vice versa.

The IC package 100 of FIG. 1 includes a package substrate 102 to which a die 106 is coupled via interconnects 122 (which may be, for example, first-level interconnects). A thermal interface material (TIM) 104 is in thermal contact with the die 106 and with a lid 110; during operation of the die 106, the TIM 104 may transfer heat generated by the die 106 to the lid 110. The lid 110 may also be referred to as a "heat spreader" or an "integrated heat spreader" when it is included in the IC package 100. The IC package 100 may also include interconnects 118, which may be used to couple the IC package 100 to another component, such as a circuit board (e.g., a motherboard), an interposer, or another IC package, as known in the art and as discussed below with reference to FIG. 8. The interconnects 118 may, in some embodiments, be any suitable second-level interconnects known in the art.

The lid 110 may include any suitable materials. In some embodiments, the lid 110 may include a foot portion 110A and a top portion 110B. The foot portion 110A may be disposed between (and may mechanically couple) the top portion 110B and the package substrate 102, and the TIM 104 may be in contact with the top portion 110B. In some embodiments, the foot portion 110A may include one or more polymers 120 and the top portion 110B may include one or more metals 121. For example, in some embodiments, the top portion 110B may include a core material and an exterior material (on which the adhesion material region 140, discussed below, is disposed). For example, in some embodiments, the core material may be copper and the exterior material may be nickel (e.g., the copper may be plated with a layer of nickel having a thickness between 5 microns and 10 microns), and thus the metal 121 may include copper and nickel. In another example, the core material may be aluminum and the exterior material may be nickel (e.g., the aluminum may be plated with a layer of nickel having a thickness between 5 microns and 10 microns), and thus the metal 121 may include copper and nickel. In some embodiments, the top portion 110B of the lid 110 may be substantially formed of a single metal 121 (e.g., aluminum). The terms "metal 121" and "polymer 120" may be used in the singular herein for ease of illustration, but any metal 121 may include one or more metals and any polymer 120 may include one or more polymers.

Although the top portion 110B of the lid 110 illustrated in FIG. 1 is shaped substantially as a rectangular solid (e.g., a "flat plate") of the metal 121, this is simply one embodiment, and other embodiments disclosed herein include top portions 110B having different shapes (e.g., as illustrated in FIGS. 2 and 3). The top portion 110B of the lid 110 may include an interior surface 110D and an exterior surface 110E. A portion of the interior surface 110D (e.g., the adhesion material region 140 at the interior surface 110D, when present) may be in contact with the TIM 104. In some embodiments, the interior surface 110D of the lid 110 may be substantially parallel to the top surface of the die 106, as is depicted in several of the accompanying drawings, but this is simply illustrative, and the interior surface 110D of a lid 110 may have any desired contour. For example, in some embodiments, the interior surface 110D of the lid 110 may be convex, with the distance between the top surface of the die 106 and the interior surface 110D of the lid 110 smaller closer to the center of the die 106 than to the edges of the die 106.

As noted above, the foot portion 110A of the lid 110 of FIG. 1 may include a polymer 120. Any suitable polymer material, or combination of polymer materials, may provide any of the polymers 120 disclosed herein. In some embodiments, the polymer 120 may include an anhydride epoxy. In some embodiments, a polymer 120 may be thermally cured or may include an ultraviolet (UV)-active species that may be cured by exposure to UV radiation. In some embodiments, the polymer 120 may include a two-part polymer (formed by combining a catalyst and a resin).

The features of a lid 110 that include a polymer 120 may be formed in any of a number of ways. In some embodiments, multiple separate layers of the polymer 120 may be stacked to form a desired feature (e.g., a foot portion 110A or a rib portion 110F, discussed further below). In such embodiments, the polymer 120 may have a sufficiently high thixotropic index so that multiple layers of it may be stacked without excessive slumping. Fabrication of an IC package 100 including a lid 110 with a polymer 120 is discussed in further detail below with reference to FIG. 5. The mechanical properties of a polymer 120 included in a lid 110 may be selected to match the mechanical requirements of the IC package 100. For example, in some embodiments, a polymer 120 included in a foot portion 110A may be capable of elongating by a length between 100 microns and 800 microns (e.g., between 100 microns and 300 microns) without mechanical failure; such an ability may aid the foot portion 110A in accommodating warpage of the IC package 100 during handling and operation.

In the embodiment of FIG. 1, the polymer 120 provides most of the vertical height of the foot portion 110A. In some embodiments, the height 152 of the polymer 120 may be greater than or equal to 50% of the height 136 of the foot portion 110A (e.g., greater than or equal to 60%, greater than or equal to 70%, greater than or equal to 80%, or greater than or equal to 90%). The same may be true of any feature of a lid 110; for example, when a rib portion 110F (discussed below with reference to FIG. 3) include a polymer 120, the height of the polymer 120 may be greater than or equal to 50% of the height of the rib portion 110F (e.g., greater than or equal to 60%, greater than or equal to 70%, greater than or equal to 80%, or greater than or equal to 90%).

In some embodiments, the TIM 104 may include a solder TIM. For example, a solder TIM 104 may include a pure indium solder or an indium alloy solder (e.g., an indium-tin solder, an indium-silver solder, an indium-gold solder, or indium-aluminum solder). In such embodiments, to facilitate the coupling between the solder TIM 104 and the die 106, a top surface of the die 106 may include an adhesion material region 146 to which the solder TIM 104 may adhere; similarly, an interior surface 110D of the lid 110 may include an adhesion material region 140 to which the solder TIM 104 may adhere. The adhesion material region 140 on the underside of the lid 110 may include any suitable material to wet the solder TIM 104. In some embodiments, the adhesion material region 140 may include gold, silver, or indium. The thickness of the adhesion material region 140 may take any suitable value (e.g., between 0.1 microns and 1 micron, or between 70 nanometers and 400 nanometers). The adhesion material region 140 may be patterned on the underside of the lid 110 to control the location of the solder TIM 104. The adhesion material region 146, like the adhesion material region 140, may include any suitable material to wet the solder TIM 104, and may take any of the forms of the adhesion material region 140 discussed above. The adhesion material region 146 may be disposed on an underlying dielectric material; in some embodiments, the adhesion material region 146 may be referred to as "back side metallization (BSM)." In some embodiments, a thickness 138 of a portion of the solder TIM 104 may be less than 1 millimeter (e.g., between 200 microns and 400 microns, between 100 microns and 600 microns, between 100 microns and 500 microns, between 5 mils and 25 mils, or between 9 mils and 16 mils). Although various ones of FIGS. 1-3 illustrate a distinct boundary between the adhesion material region 140 and the TIM 104 (and also between the adhesion material region 146 and the TIM 104), in practice, the adhesion material region 140 and a solder TIM 104 (and the adhesion material region 146 and a solder TIM 104) may react and form an intermetallic compound (IMC).

For example, when the adhesion material region 140 (adhesion material region 146) includes gold and the solder TIM 104 includes indium, the resulting IMC may be a gold-indium IMC. In an IC package 100, the adhesion material regions 140/146 may not be distinctly visible; instead, the IMC resulting from the reaction between these adhesion material regions 140/146 and the solder TIM 104 may be present at these interfaces.

In some embodiments, the TIM 104 may include a polymer TIM. In some such embodiments, no adhesion material regions 140/146 may be present in an IC package 100. In some embodiments, the TIM 104 may include a polymer TIM and a solder TIM arranged in any desired manner.

The package substrate 102 may include a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the top and bottom surfaces, or between different locations on the top surface, and/or between different locations on the bottom surface. These conductive pathways may take the form of any of the interconnects 1628 discussed below with reference to FIG. 7 (e.g., including lines and vias). The package substrate 102 may be coupled to the die 106 by interconnects 122, which may include conductive contacts that are coupled to conductive pathways (not shown) through the package substrate 102, allowing circuitry within the die 106 to electrically couple to the interconnects 118 (or to other devices included in the package substrate 102, not shown). As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). The interconnects 122 illustrated in FIG. 1 include solder bumps, but the interconnects 122 may take any suitable form (e.g., wirebonds, a waveguide, etc.). Similarly, the interconnects 118 illustrated in FIG. 1 include solder balls (e.g., for a ball grid array (BGA) arrangement), but any suitable interconnects 118 may be used (e.g., pins in a pin grid array (PGA) arrangement or lands in a land grid array (LGA) arrangement). Further, although the IC package 100 of FIG. 1 includes a die 106 coupled directly to a package substrate 102, in other embodiments (e.g., as discussed below with reference to FIG. 3), an intermediate component may be disposed between the die 106 and the package substrate 102 (e.g., an interposer 108, as illustrated in FIG. 3, a silicon bridge, an organic bridge, etc.).

The die 106 may take the form of any of the embodiments of the die 1502 discussed below with reference to FIG. 6 (e.g., may include any of the embodiments of the IC device 1600 of FIG. 7). The die 106 may include circuitry to perform any desired functionality. For example, the die 106 may be a logic die (e.g., silicon-based dies), a memory die (e.g., high bandwidth memory), or may include a combination of logic and memory. In some embodiments, the IC package 100 may be a server package. The thickness 154 of a die 106 may take any suitable value; for example, in some embodiments, the thickness 154 of a die 106 may be between 200 microns and 800 microns. In some embodiments, when a foot portion 110A includes a polymer 120, the height 152 of the polymer 120 may be greater than a thickness 154 of the die 106. In embodiments in which the IC package 100 includes multiple dies 106 (e.g., as discussed below with reference to FIG. 3), the IC package 100 may be referred to as a multi-chip package (MCP). An IC package 100 may include passive components not shown in various ones of the accompanying figures for ease of illustration, such as surface-mount resistors, capacitors, and inductors (e.g., coupled to the top or bottom surface of the package substrate 102). More generally, an IC package 100 may include any other active or passive components known in the art.

FIG. 2 is a side, cross-sectional view of another example of an IC packages 100 having a lid 110 with one or more polymer features. As noted above, many of the elements of the IC package 100 of FIG. 2 (and FIGS. 3-6) may be shared with the IC package 100 of FIG. 1, and a discussion of these elements is not repeated; these elements may take the form of any of the embodiments discussed above with reference to FIG. 1, for example. Further, any of the features illustrated in FIGS. 1-6 may be combined with any of the other features illustrated in FIGS. 1-6. For example, FIG. 2 illustrates an embodiment in which the metal 121 is not a rectangular solid, and FIG. 3 illustrates an embodiment in which a polymer 120 is part of the rib portions 110F of the lid 110; the embodiments of FIGS. 2 and 3 may be combined so that an IC package 100, in accordance with the present disclosure, includes a metal 121 that is not a rectangular solid, and one or more rib portions 110F of the lid 110 include a polymer 120, for example.

As noted above, FIG. 2 depicts an embodiment in which the metal 121 is not a rectangular solid; instead, the metal 121 provides more of the foot portion 110A than does the metal 121 of the embodiment of FIG. 1. As noted above with reference to FIG. 1, in the embodiment of FIG. 3, the polymer 120 may provide most of the vertical height of the foot portion 110A. In some embodiments like that of FIG. 3, the height 152 of the polymer 120 may be greater than or equal to 50% of the height 136 of the foot portion 110A (e.g., greater than or equal to 60%, greater than or equal to 70%, greater than or equal to 80%, or greater than or equal to 90%).

Figure 3A:
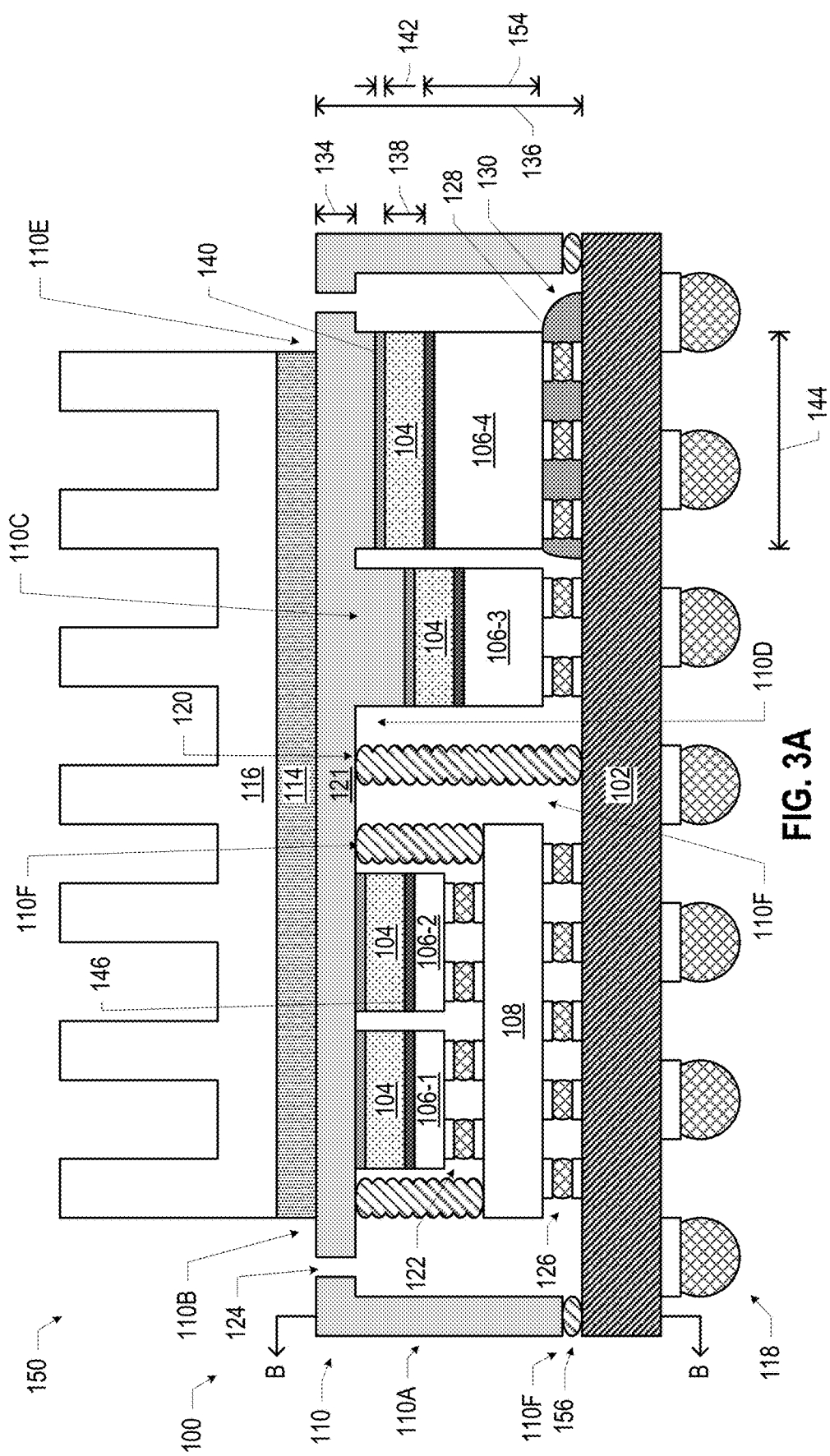

FIG. 3 depicts various views of example IC assembly 150 including an example IC package 100 with a lid 110; in particular, FIG. 3B is a side, cross-sectional view through the section B-B of FIG. 3A, and FIG. 3A is a side, cross-sectional view through the section A-A of FIG. 3B. Although a particular arrangement of polymer 120 is depicted in FIG. 3, any one or more features of the lid 110 may include polymer 120, as desired. More generally, the lid 110 of FIG. 3 may include features or combinations of features that take the form of any of the embodiments discussed above with reference to FIGS. 1-2 (e.g., the relative contribution of the polymer 120 and the metal 121 to a feature, etc.). Further, any of the elements of FIG. 3 may take the form of any corresponding elements in FIGS. 1 and 2; discussion of these elements will not be repeated. Similarly, an IC package 100 or an IC assembly 150 may include any combination or subset of the elements of FIGS. 1-3; for example, the IC package 100 of FIG. 1 may include one or more vent holes 124 and/or one or more pedestals 110C, the IC package 100 of FIG. 3 may include fewer or no rib portions 110F, etc.

The IC assembly 150 includes an IC package 100, a heat sink 116, and a TIM 114 therebetween. The TIM 114 may aid in the transfer of heat from the lid 110 to the heat sink 116, and the heat sink 116 may be designed to readily dissipate heat into the surrounding environment, as known in the art.

The IC package 100 of FIG. 3 is an MCP, and includes four dies 106-1, 106-2, 106-3, and 106-4. The particular number and arrangement of dies in FIG. 3 is simply illustrative, and any number and arrangement may be included in an IC package 100. The dies 106-1 and 106-2 are coupled to an interposer 108 by interconnects 122, and the interposer 108 is coupled to the package substrate 102 by interconnects 126 (which may take the form of any of the interconnects 122 disclosed herein, such as first-level interconnects). The interposer 108 may be a silicon interposer (providing conductive pathways between the die 106-1 and the die 106-2), and may or may not include any active devices (e.g., transistors) and/or passive devices (e.g., capacitors, inductors, resistors, etc.). The dies 106-3 and 106-4 are coupled to the package substrate 102 directly. Any of the dies 106 disclosed herein may have any suitable dimensions; for example, in some embodiments, a die 106 may have a side length 144 between 5 millimeters and 50 millimeters.

All of the dies 106 of FIG. 3 include an adhesion material region 146 on the top surface, and the lid 110 includes corresponding adhesion material regions 140 on its underside; different portions of TIM 104 are between corresponding adhesion material regions 140/146; as noted above, in various embodiments, some or all of the adhesion material regions 140 and 146 may be omitted. In some embodiments, the adhesion material region 140 may have a thickness 142 between 0.1 microns and 1 micron; the thickness of the adhesion material region 146 may be in the same range. As discussed above, when the TIM 104 is a solder TIM, the thickness of the solder TIM 104 of FIG. 3 may, in practice, include portions of IMC (not shown) proximate to or in place of the adhesion material regions 140/146; in some embodiments, a portion of IMC may have a thickness between 10 mils and 20 mils.

The lid 110 of FIG. 3 includes a foot portion 110A, as discussed above with reference to FIG. 1, and also includes rib portions 110F and pedestals 110C. In the embodiment of FIG. 3, the foot portion 110A is provided by the metal 121, and is mechanically coupled to the package substrate 102 by a sealant 156. The sealant 156 may have a thickness that is less than 150 microns (in contrast to the polymer 120 used as a feature of a lid 110, which may have a height 152 that is greater than 150 microns). In some embodiments, a height 136 of the foot portion 110A may be between 600 microns and 1 millimeter. Rib portions 110F may provide mechanical support to the lid 110, and may control spacing between various elements of the IC package 100 and the lid 110. FIG. 3 illustrates a single rib portion 110F coupled to the package substrate 102, and also illustrates two rib portions 110F coupled to a top surface of the interposer 108. In the embodiment of FIG. 3, all of the rib portions 110F include polymer 120; in other embodiments, some, all, or no rib portions 110F may include polymer 120 (and may instead be provided by a metal 121 and coupled to proximate structures by a sealant 156). Pedestals 110C may be "downward" projections in the upper portion of the lid 110 that bring the material of the lid 110 into closer proximity with a corresponding die 106; for example, FIG. 3 illustrates pedestals 110C associated with each of the dies 106-3 and 106-4. The pedestals 110C may have adhesion material regions 140 thereon, when appropriate, and portions of TIM 104 may be disposed between the pedestals 110C and the associated dies 106-3/106-4, as shown. In some embodiments, a minimum thickness 134 of the top portion 110B of the lid 110 may be between 0.5 millimeters and 4 millimeters (e.g., between 0.5 millimeters and 3 millimeters, or between 0.7 millimeters and 3.5 millimeters).

In some embodiments, the lid 110 may include one or more vent holes 124 in locations that are not above a die 106 (e.g., in the top portion 110B, proximate to the foot portion 110A, as shown). These vent holes 124 may allow gas generated during manufacturing (e.g., gas generated by heated flux on a solder TIM 104 during BGA processing) to escape into the environment and for pressure to be equalized under and outside of the lid 110. In some embodiments, gaps 132 in the sealant 156 between the foot portion 110A and the package substrate 102 may allow gas to escape (instead of or in addition to the use of vent holes 124) and for pressure to be equalized under and outside of the lid 110; an example of such gaps 132 is illustrated in FIG. 3B. Such gaps 132 may also be present when the foot portion 110A includes a polymer 120 (e.g., in the embodiments of FIGS. 1-2 and 4).

In some embodiments, an underfill material 128 may be disposed around the interconnects coupling an element to the package substrate 102 (e.g., around the interconnects 126 between the interposer 108 and the package substrate 102, and/or around the interconnects 122 between the dies 106-3/106-4 and the package substrate 102). The underfill material 128 may provide mechanical support to these interconnects, helping to mitigate the risk of cracking or delamination due to differential thermal expansion between the package substrate 102 and the dies 106/interposer 108. A single portion of underfill material 128 is depicted in FIG. 3 for ease of illustration, but portions of underfill material 128 may be used in any desired locations. Example materials that may be used for the underfill material 128 include epoxy materials. In some embodiments, the underfill material 128 is created by depositing a fluid underfill material 128 at a location on the package substrate 102 that is next to the die 106 (or other element), and allowing capillary action to draw the fluid underfill material 128 into the area between the die 106 and the package substrate 102. Such a technique may result in an asymmetric distribution of the underfill material 128 relative to the footprint of the die 106 (or other element); in particular, a tongue 130 of underfill material 128 may extend farther out away from the die 106 on the side where the underfill material 128 was initially deposited than on other sides of the die 106. An example of this is shown in FIG. 3A.

FIGS. 1-3 illustrate embodiments in which the polymer 120 included in a feature of a lid 110 has an undulating profile. Such a profile may be the result of fabrication by successive deposition of multiple layers of the polymer 120, forming a taller feature. In some embodiments, a polymer 120 in a lid 110 (e.g., when the polymer 120 is included in a foot portion 110A or a rib portion 110F) may have a necked profile. Such a profile may be the result of stretching that occurs when the polymer 120 cures and mechanically couples the metal portion 121 and the package substrate 102 or interposer 108 (for example). FIGS. 4A and 4B are side, cross-sectional views of example foot portions 110A that include a polymer 120, and illustrate examples of necked profiles of the polymer 120.

IC packages 100 including lids 110 that have polymer features may be manufactured using any suitable techniques. For example, FIGS. 5A-5F illustrate various stages in an example process for manufacturing the IC package 100 of FIG. 1. A process like that illustrated in FIGS. 5A-5F may be used to manufacture any suitable ones of the IC packages 100 disclosed herein, and a number of variations on the illustrated process are discussed below.

Figure 5A:
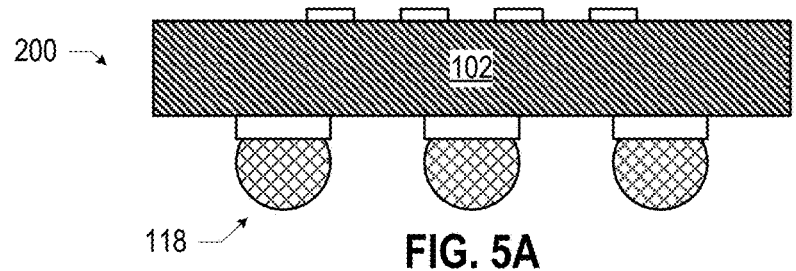
FIGS. 5A-5F illustrate various stages in the manufacture of an example IC package with a lid having one or more polymer features, in accordance with various embodiments.

FIG. 5A depicts an assembly 200 including the package substrate 102 and interconnects 118. These elements may take the form of any of the embodiments of these elements discussed herein.

Figure 5B:
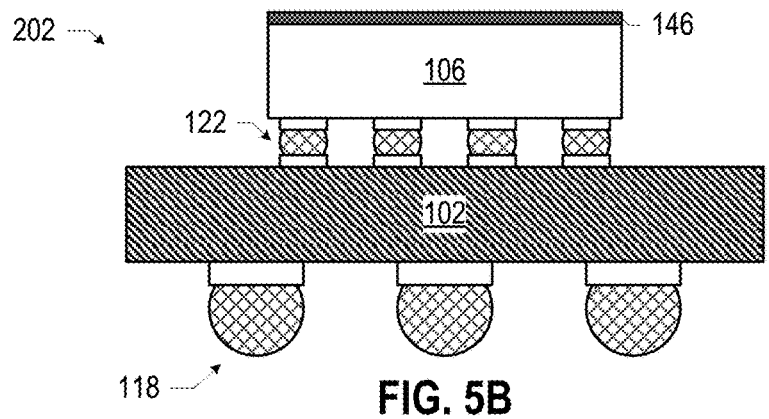

FIG. 5B depicts an assembly 202 subsequent to positioning the die 106 on the conductive contacts of the package substrate 102 of the assembly 200 (FIG. 5A). Although the interconnects 122 are labeled in FIG. 5B, in some embodiments, these interconnects 122 may not yet be reflowed in the assembly 202; in some embodiments, reflow may be performed later.

Figure 5C:
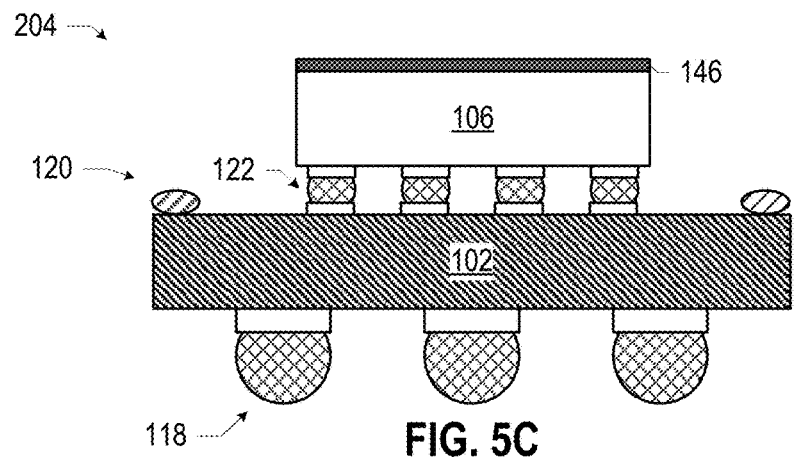

FIG. 5C depicts an assembly 204 subsequent to providing an initial amount of polymer 120 on the top surface of the package substrate 102 of the assembly 202 (FIG. 5B), and curing the initial amount of polymer 120 (e.g., by UV or thermal curing). This initial amount of polymer may be deposited using any suitable dispense tool (e.g., by screen printing or auger dispense), and may be deposited in any desired pattern on the surface of the package substrate 102. In this example, the initial amount of polymer 120 may be dispensed in a pattern and locations suitable for the subsequent buildup of the bulk of the foot portion 110A, as discussed below.

Figure 5D:
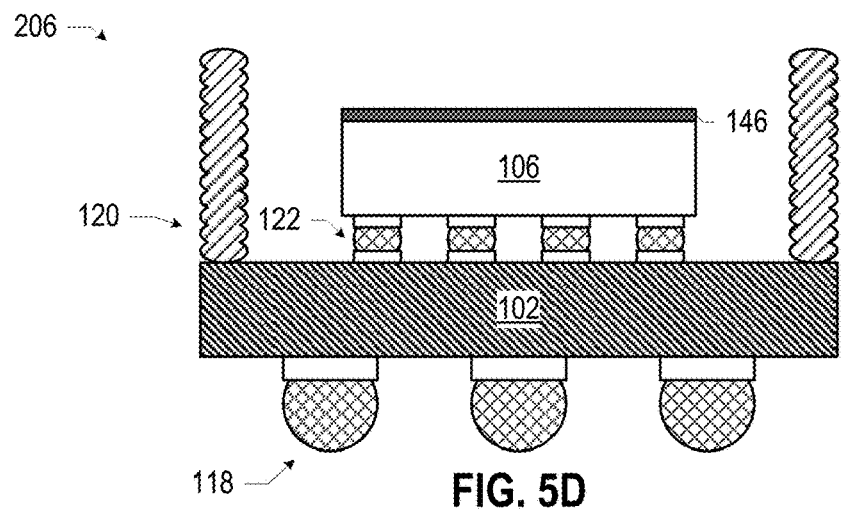

FIG. 5D depicts an assembly 206 subsequent to providing multiple rounds of additional polymer 120 on the initial amount of polymer 120 of the assembly 204 (FIG. 5C). Each round of deposition of the polymer 120 may be followed by a curing process. The number of rounds may depend on the desired height of the final polymer structure, and as noted previously, these subsequent rounds may be deposited in any desired pattern. The last round of polymer 120 may not be cured prior to subsequent operations (in particular, prior to the positioning of the metal 121, as discussed below with reference to FIG. 5F) so that the polymer 120 at the "top" remains tacky for coupling to the metal 121.

Figure 5E:
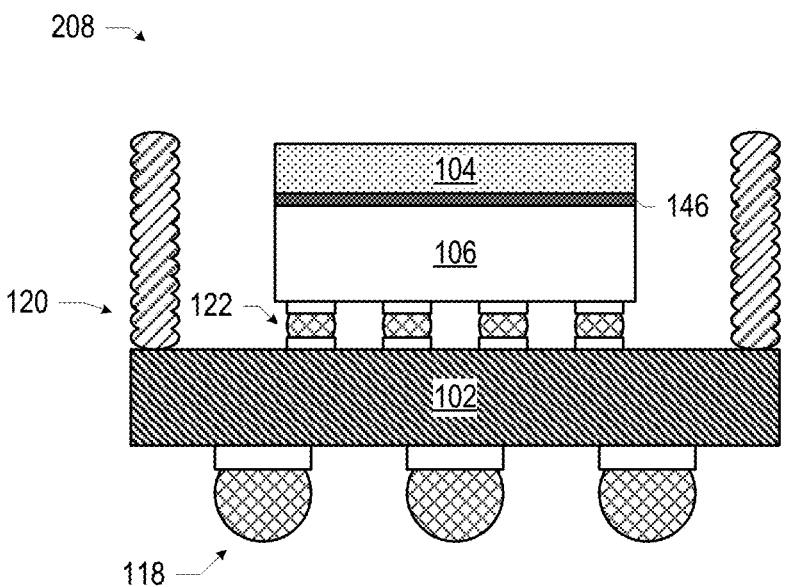

FIG. 5E depicts an assembly 208 subsequent to positioning the TIM 104 on the die 106 of the assembly 206 (FIG. 5D). In some embodiments, the TIM 104 of the assembly 208 may be a solder TIM preform, or a portion of polymer TIM.

Figure 5F:
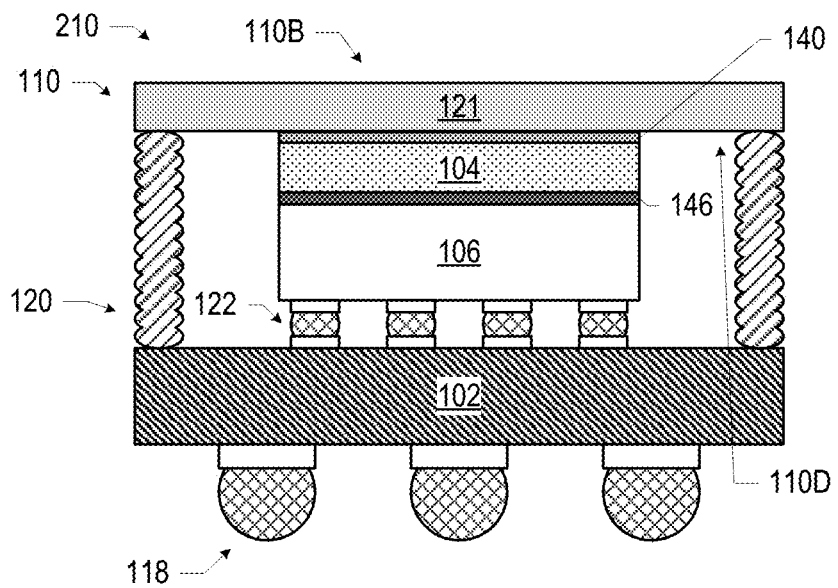

FIG. 5F depicts an assembly 210 subsequent to positioning the metal 121 on the polymer 120 of the assembly 208 (FIG. 5E), then curing the result to mechanically secure the metal 121 to the polymer 120. The metal 121 and the polymer 120 together provide the foot portion 110A while the metal 121 provides the top portion 110B of a lid 110.

The IC packages 100 disclosed herein may include, or may be included in, any suitable electronic component. FIGS. 6-9 illustrate various examples of apparatuses that may be included in any of the IC packages 100 disclosed herein, or may include any of the IC packages 100 disclosed herein.

Figure 6:
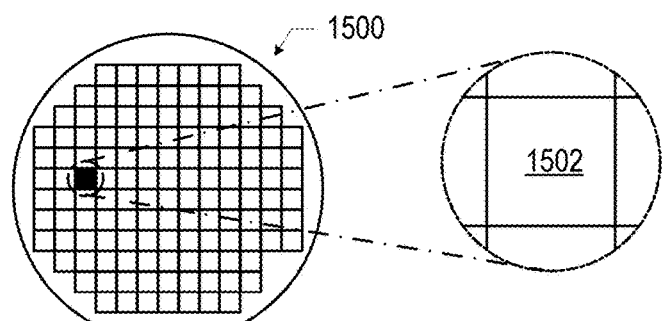
FIG. 6 is a top view of a wafer and dies that may be included in an IC package with a lid having one or more polymer features, in accordance with various embodiments.

FIG. 6 is a top view of a wafer 1500 and dies 1502 that may be included in an IC package 100, in accordance with various embodiments. For example, a die 1502 may be a die 106. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 7, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 9) or other logic that is configured to store information in the memory devices or execute instructions stored in the memory array.

Figure 7:
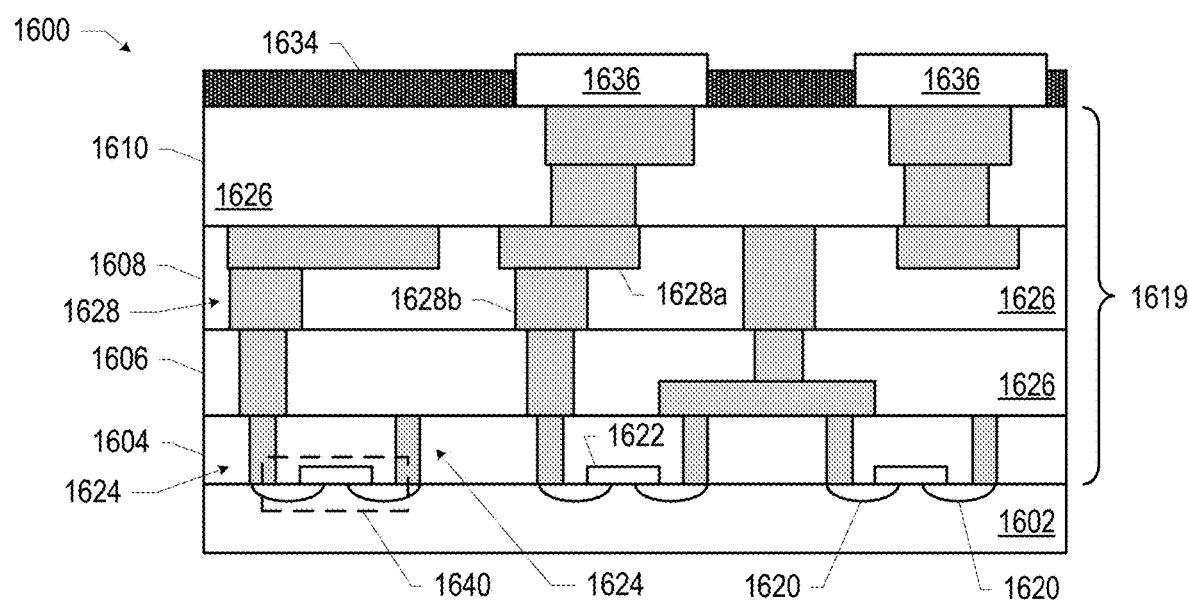
FIG. 7 is a side, cross-sectional view of an IC device that may be included in an IC package with a lid having one or more polymer features, in accordance with various embodiments.

FIG. 7 is a side, cross-sectional view of an IC device 1600 that may be included in an IC package 100, in accordance with various embodiments. For example, the IC device 1600 may be a die 106. One or more of the IC devices 1600 may be included in one or more dies 1502 (FIG. 6). The IC device 1600 may be formed on a substrate 1602 (e.g., the wafer 1500 of FIG. 6) and may be included in a die (e.g., the die 1502 of FIG. 6). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 6) or a wafer (e.g., the wafer 1500 of FIG. 6).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 7 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 7 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 7). Although a particular number of interconnect layers 1606-1610 is depicted in FIG. 7, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 7. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 7. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 7, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 8:
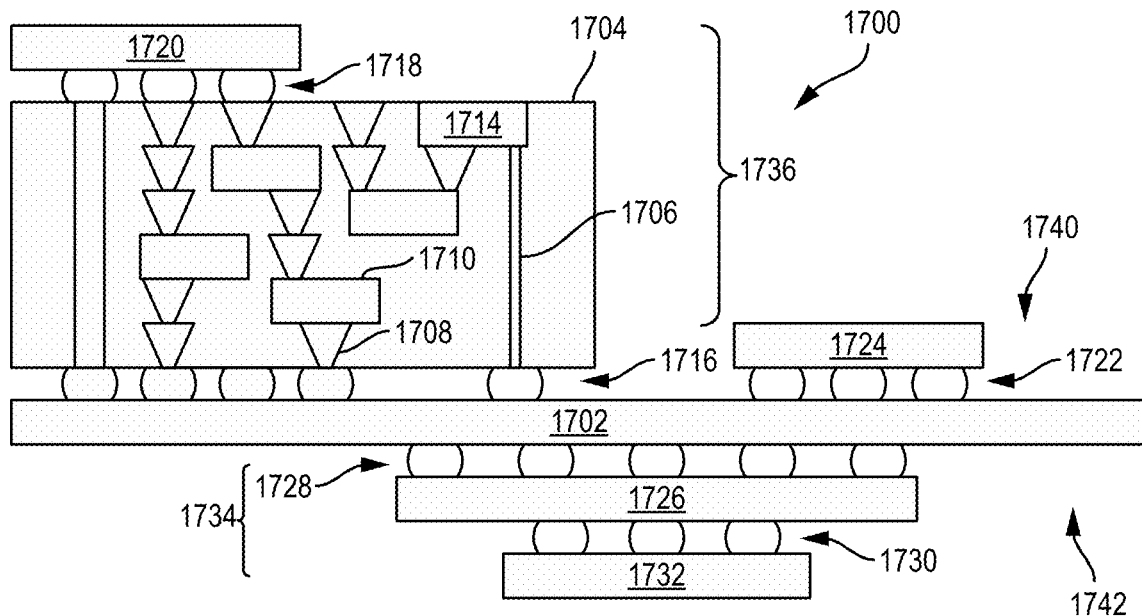
FIG. 8 is a side, cross-sectional view of an IC assembly that may include an IC package with a lid having one or more polymer features, in accordance with various embodiments.

FIG. 8 is a side, cross-sectional view of an IC assembly 1700 that may include one or more IC packages 100, in accordance with various embodiments. For example, any of the IC packages included in the IC assembly 1700 may be an IC package 100 (e.g., may include a lid 110). The IC assembly 1700 includes a number of components disposed on a circuit board 1702 (which may be, e.g., a motherboard). The IC assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC assembly 1700 illustrated in FIG. 8 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 8), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 8, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 6), an IC device (e.g., the IC device 1600 of FIG. 7), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 8, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC assembly 1700 illustrated in FIG. 8 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 9:
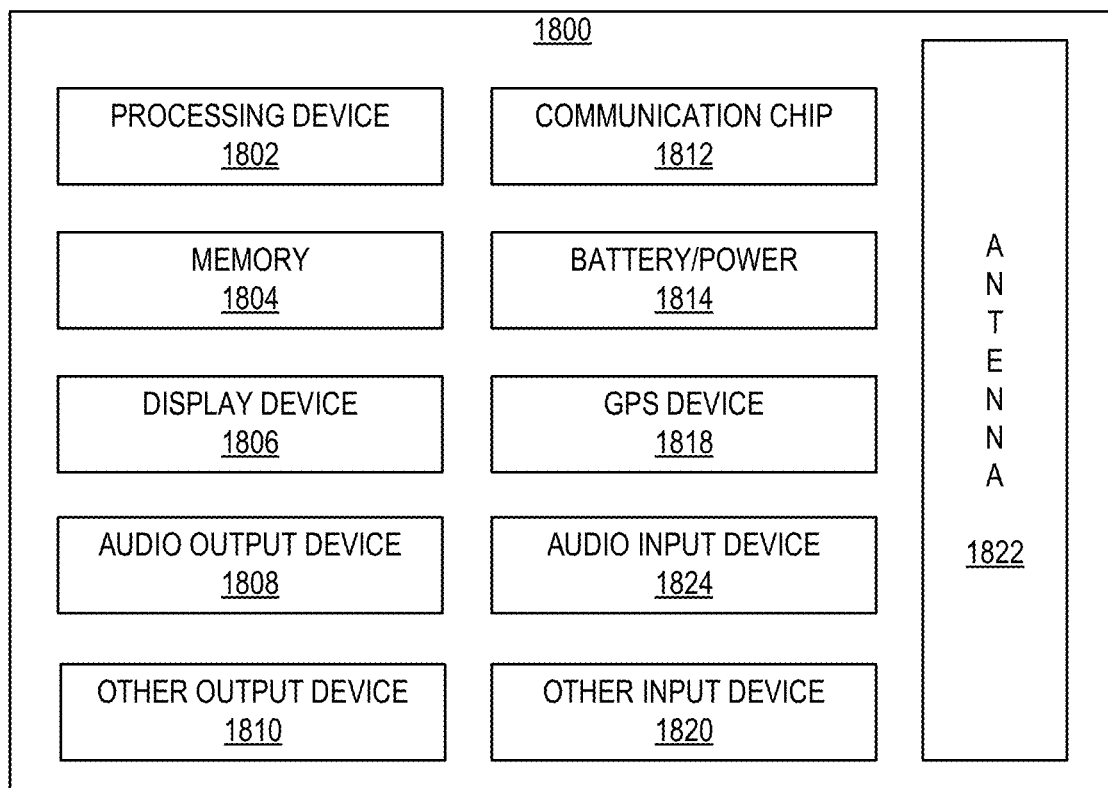
FIG. 9 is a block diagram of an example electrical device that may include an IC package with a lid having one or more polymer features, in accordance with various embodiments.

FIG. 9 is a block diagram of an example electrical device 1800 that may include one or more IC packages 100, in accordance with various embodiments. For example, any suitable ones of the components of the electrical device 1800 may include one or more of the IC assemblies 150/1700, IC packages 100, IC devices 1600, or dies 1502 disclosed herein. A number of components are illustrated in FIG. 9 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 9, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) package, including: a package support; a die; and a lid, wherein the die is between the package support and the lid, the lid includes a polymer portion, and a height of the polymer portion is greater than 150 microns.

Example 2 includes the subject matter of Example 1, and further specifies that the package support includes a package substrate.

Example 3 includes the subject matter of any of Examples 1-2, and further specifies that the package support includes an interposer.

Example 4 includes the subject matter of any of Examples 1-3, and further specifies that the polymer portion is at least a part of a foot of the lid.

Example 5 includes the subject matter of Example 4, and further specifies that the height of the polymer portion is at least 80% of a height of the foot.

Example 6 includes the subject matter of any of Examples 1-3, and further specifies that the polymer portion is at least a part of a rib of the lid.

Example 7 includes the subject matter of Example 6, and further specifies that the height of the polymer portion is at least 80% of a height of the rib.

Example 8 includes the subject matter of any of Examples 1-7, and further specifies that the polymer portion is in contact with the package support.

Example 9 includes the subject matter of any of Examples 1-8, and further specifies that the lid includes a metal portion, and the polymer portion is between the metal portion and the package support.

Example 10 includes the subject matter of Example 9, and further specifies that the metal portion is a rectangular solid.

Example 11 includes the subject matter of Example 9, and further specifies that the metal portion is not a rectangular solid.

Example 12 includes the subject matter of any of Examples 9-11, and further specifies that the metal portion includes copper or aluminum.

Example 13 includes the subject matter of Example 12, and further specifies that the metal portion includes nickel.

Example 14 includes the subject matter of any of Examples 1-13, and further specifies that the polymer portion has a necked profile.

Example 15 includes the subject matter of any of Examples 1-14, and further specifies that the polymer portion has an undulating profile.

Example 16 includes the subject matter of any of Examples 1-15, and further specifies that the height of the polymer portion is greater than a thickness of the die.

Example 17 includes the subject matter of any of Examples 1-16, and further specifies that the height of the polymer portion is between 200 microns and Example 1.5 millimeters.

Example 18 includes the subject matter of any of Examples 1-17, and further specifies that the polymer portion may be stretched up to 300 microns without mechanical failure of the polymer portion.

Example 19 includes the subject matter of Example 18, and further specifies that the polymer portion may be stretched up to 800 microns without mechanical failure of the polymer portion.

Example 20 includes the subject matter of any of Examples 1-19, and further includes: a thermal interface material (TIM) between the die and the lid.

Example 21 includes the subject matter of Example 20, and further specifies that the TIM includes a solder TIM.

Example 22 includes the subject matter of Example 21, and further specifies that the lid includes a metal layer, and the solder TIM is in contact with the metal layer.

Example 23 includes the subject matter of Example 22, and further specifies that the metal layer includes gold or silver.

Example 24 includes the subject matter of any of Examples 22-23, and further specifies that the metal layer has a thickness between Example 0.1 microns and 1 micron.

Example 25 includes the subject matter of any of Examples 20-24, and further specifies that the TIM includes a polymer TIM.

Example 26 includes the subject matter of any of Examples 1-25, and further specifies that the IC package is a ball grid array package.

Example 27 includes the subject matter of any of Examples 1-26, and further specifies that the lid includes a pedestal, and the die is between the pedestal and the package support.

Example 28 includes the subject matter of any of Examples 1-27, and further includes: an underfill material at least partially between the die and the package support.

Example 29 is an integrated circuit (IC) package, including: a package support; a die; and a lid, wherein the die is between the package support and the lid, the lid includes a feature having a polymer portion, and a height of the polymer portion is at least 80% of a height of the feature.

Example 30 includes the subject matter of Example 29, and further specifies that the package support includes a package substrate.

Example 31 includes the subject matter of any of Examples 29-30, and further specifies that the package support includes an interposer.

Example 32 includes the subject matter of any of Examples 29-31, and further specifies that the feature is a foot.

Example 33 includes the subject matter of Example 32, and further specifies that the height of the polymer portion is greater than 150 microns.

Example 34 includes the subject matter of any of Examples 29-31, and further specifies that the feature is a rib.

Example 35 includes the subject matter of Example 34, and further specifies that the height of the polymer portion is greater than 150 microns.

Example 36 includes the subject matter of any of Examples 30-35, and further specifies that the polymer portion is in contact with the package support.

Example 37 includes the subject matter of any of Examples 29-36, and further specifies that the lid includes a metal portion, and the polymer portion is between the metal portion and the package support.

Example 38 includes the subject matter of Example 37, and further specifies that the metal portion is a rectangular solid.

Example 39 includes the subject matter of Example 37, and further specifies that the metal portion is not a rectangular solid.

Example 40 includes the subject matter of any of Examples 37-39, and further specifies that the metal portion includes copper or aluminum.

Example 41 includes the subject matter of Example 40, and further specifies that the metal portion includes nickel.

Example 42 includes the subject matter of any of Examples 29-41, and further specifies that the polymer portion has a necked profile.

Example 43 includes the subject matter of any of Examples 29-42, and further specifies that the polymer portion has an undulating profile.

Example 44 includes the subject matter of any of Examples 29-43, and further specifies that the height of the polymer portion is greater than a thickness of the die.

Example 45 includes the subject matter of any of Examples 29-44, and further specifies that the height of the polymer portion is between 200 microns and Example 1.5 millimeters.

Example 46 includes the subject matter of any of Examples 29-45, and further specifies that the polymer portion may be stretched up to 300 microns without mechanical failure of the polymer portion.

Example 47 includes the subject matter of Example 46, and further specifies that the polymer portion may be stretched up to 800 microns without mechanical failure of the polymer portion.

Example 48 includes the subject matter of any of Examples 29-47, and further includes: a thermal interface material (TIM) between the die and the lid.

Example 49 includes the subject matter of Example 48, and further specifies that the TIM includes a solder TIM.

Example 50 includes the subject matter of Example 49, and further specifies that the lid includes a metal layer, and the solder TIM is in contact with the metal layer.

Example 51 includes the subject matter of Example 50, and further specifies that the metal layer includes gold or silver.

Example 52 includes the subject matter of any of Examples 50-51, and further specifies that the metal layer has a thickness between Example 0.1 microns and 1 micron.

Example 53 includes the subject matter of any of Examples 50-52, and further specifies that the TIM includes a polymer TIM.

Example 54 includes the subject matter of any of Examples 29-53, and further specifies that the IC package is a ball grid array package.

Example 55 includes the subject matter of any of Examples 29-54, and further specifies that the lid includes a pedestal, and the die is between the pedestal and the package support.

Example 56 includes the subject matter of any of Examples 29-55, and further includes: an underfill material at least partially between the die and the package support.

Example 57 is an integrated circuit (IC) package, including: a package support; a die; and a lid, wherein the die is between the package support and the lid, the lid includes a polymer portion, and a height of the polymer portion is greater than a thickness of the die.

Example 58 includes the subject matter of Example 57, and further specifies that the package support includes a package substrate.

Example 59 includes the subject matter of any of Examples 57-58, and further specifies that the package support includes an interposer.

Example 60 includes the subject matter of any of Examples 57-59, and further specifies that the polymer portion is at least a part of a foot of the lid.

Example 61 includes the subject matter of Example 60, and further specifies that the height of the polymer portion is at least 80% of a height of the foot.

Example 62 includes the subject matter of any of Examples 57-59, and further specifies that the polymer portion is at least a part of a rib of the lid.

Example 63 includes the subject matter of Example 62, and further specifies that the height of the polymer portion is at least 80% of a height of the rib.

Example 64 includes the subject matter of any of Examples 57-63, and further specifies that the polymer portion is in contact with the package support.

Example 65 includes the subject matter of any of Examples 57-64, and further specifies that the lid includes a metal portion, and the polymer portion is between the metal portion and the package support.

Example 66 includes the subject matter of Example 65, and further specifies that the metal portion is a rectangular solid.

Example 67 includes the subject matter of Example 65, and further specifies that the metal portion is not a rectangular solid.

Example 68 includes the subject matter of any of Examples 65-67, and further specifies that the metal portion includes copper or aluminum.

Example 69 includes the subject matter of Example 68, and further specifies that the metal portion includes nickel.

Example 70 includes the subject matter of any of Examples 57-69, and further specifies that the polymer portion has a necked profile.

Example 71 includes the subject matter of any of Examples 57-70, and further specifies that the polymer portion has an undulating profile.

Example 72 includes the subject matter of any of Examples 57-71, and further specifies that the height of the polymer portion is greater than 150 microns.

Example 73 includes the subject matter of any of Examples 57-72, and further specifies that the height of the polymer portion is between 200 microns and Example 1.5 millimeters.

Example 74 includes the subject matter of any of Examples 57-73, and further specifies that the polymer portion may be stretched up to 300 microns without mechanical failure of the polymer portion.

Example 75 includes the subject matter of Example 74, and further specifies that the polymer portion may be stretched up to 800 microns without mechanical failure of the polymer portion.

Example 76 includes the subject matter of any of Examples 57-75, and further includes: a thermal interface material (TIM) between the die and the lid.

Example 77 includes the subject matter of Example 76, and further specifies that the TIM includes a solder TIM.

Example 78 includes the subject matter of Example 77, and further specifies that the lid includes a metal layer, and the solder TIM is in contact with the metal layer.

Example 79 includes the subject matter of Example 78, and further specifies that the metal layer includes gold or silver.

Example 80 includes the subject matter of any of Examples 78-79, and further specifies that the metal layer has a thickness between Example 0.1 microns and 1 micron.

Example 81 includes the subject matter of any of Examples 76-80, and further specifies that the TIM includes a polymer TIM.

Example 82 includes the subject matter of any of Examples 57-81, and further specifies that the IC package is a ball grid array package.

Example 83 includes the subject matter of any of Examples 57-82, and further specifies that the lid includes a pedestal, and the die is between the pedestal and the package support.

Example 84 includes the subject matter of any of Examples 57-83, and further includes: an underfill material at least partially between the die and the package support.

Example 85 is an integrated circuit (IC) package, including: a package support; a die; and a lid, wherein the die is between the package support and the lid, the lid includes a polymer portion, and the polymer portion has an undulating or necked profile.

Example 86 includes the subject matter of Example 85, and further specifies that the package support includes a package substrate.

Example 87 includes the subject matter of any of Examples 85-86, and further specifies that the package support includes an interposer.

Example 88 includes the subject matter of any of Examples 85-87, and further specifies that the polymer portion is at least a part of a foot of the lid.

Example 89 includes the subject matter of Example 88, and further specifies that a height of the polymer portion is at least 80% of a height of the foot.

Example 90 includes the subject matter of any of Examples 85-87, and further specifies that the polymer portion is at least a part of a rib of the lid.

Example 91 includes the subject matter of Example 90, and further specifies that a height of the polymer portion is at least 80% of a height of the rib.

Example 92 includes the subject matter of any of Examples 85-91, and further specifies that the polymer portion is in contact with the package support.

Example 93 includes the subject matter of any of Examples 85-92, and further specifies that the lid includes a metal portion, and the polymer portion is between the metal portion and the package support.

Example 94 includes the subject matter of Example 93, and further specifies that the metal portion is a rectangular solid.

Example 95 includes the subject matter of Example 93, and further specifies that the metal portion is not a rectangular solid.

Example 96 includes the subject matter of any of Examples 93-95, and further specifies that the metal portion includes copper or aluminum.

Example 97 includes the subject matter of Example 96, and further specifies that the metal portion includes nickel.

Example 98 includes the subject matter of any of Examples 85-97, and further specifies that the polymer portion has a necked profile.

Example 99 includes the subject matter of any of Examples 85-98, and further specifies that the polymer portion has an undulating profile.

Example 100 includes the subject matter of any of Examples 85-99, and further specifies that the height of the polymer portion is greater than a thickness of the die.

Example 101 includes the subject matter of any of Examples 85-100, and further specifies that the height of the polymer portion is between 200 microns and Example 1.5 millimeters.

Example 102 includes the subject matter of any of Examples 85-101, and further specifies that the polymer portion may be stretched up to 300 microns without mechanical failure of the polymer portion.

Example 103 includes the subject matter of Example 102, and further specifies that the polymer portion may be stretched up to 800 microns without mechanical failure of the polymer portion.

Example 104 includes the subject matter of any of Examples 85-103, and further includes: a thermal interface material (TIM) between the die and the lid.

Example 105 includes the subject matter of Example 104, and further specifies that the TIM includes a solder TIM.

Example 106 includes the subject matter of Example 105, and further specifies that the lid includes a metal layer, and the solder TIM is in contact with the metal layer.

Example 107 includes the subject matter of Example 106, and further specifies that the metal layer includes gold or silver.

Example 108 includes the subject matter of any of Examples 106-107, and further specifies that the metal layer has a thickness between Example 0.1 microns and 1 micron.

Example 109 includes the subject matter of any of Examples 104-108, and further specifies that the TIM includes a polymer TIM.

Example 110 includes the subject matter of any of Examples 85-109, and further specifies that the IC package is a ball grid array package.

Example 111 includes the subject matter of any of Examples 85-110, and further specifies that the lid includes a pedestal, and the die is between the pedestal and the package support.

Example 112 includes the subject matter of any of Examples 85-111, and further includes: an underfill material at least partially between the die and the package support.

Example 113 is an integrated circuit (IC) assembly, including: an IC package in accordance with any of Examples 1-112; and a circuit board coupled to the IC package.

Example 114 includes the subject matter of Example 113, and further specifies that the circuit board is a motherboard.

Example 115 includes the subject matter of any of Examples 113-114, and further includes: a heat sink, wherein the lid is between the heat sink and the circuit board.

Example 116 includes the subject matter of Example 115, and further includes: a polymer TIM between the lid and the heat sink.

Example 117 includes the subject matter of any of Examples 113-116, and further includes: a housing around the IC package and the circuit board.

Example 118 includes the subject matter of any of Examples 113-117, and further includes: wireless communication circuitry communicatively coupled to the circuit board.

Example 119 includes the subject matter of any of Examples 113-118, and further includes: a display communicatively coupled to the circuit board.

Example 120 includes the subject matter of any of Examples 113-119, and further specifies that the IC assembly is a mobile computing device.

Example 121 includes the subject matter of any of Examples 113-119, and further specifies that the IC assembly is a server computing device.

Example 122 includes the subject matter of any of Examples 113-119, and further specifies that the IC assembly is a wearable computing device.

Example 123 includes the subject matter of any of Examples 113-119, and further specifies that the IC package is coupled to the circuit board by ball grid array interconnects.

Example 124 includes the subject matter of any of Examples 113-123, and further specifies that the lid has a concave interior surface.

Example 125 is a method of manufacturing an integrated circuit (IC) package, including: providing a polymer portion on a package support; providing a die on the package support; and after providing the die on the package support, providing a metal portion on the polymer portion.

Example 126 includes the subject matter of Example 125, and further specifies that providing the polymer portion comprises screen printing the polymer portion.

Example 127 includes the subject matter of Example 125, and further specifies that providing the polymer portion comprises performing multiple cycles of polymer dispense and cure.

Example 128 includes the subject matter of Example 125, and further includes: curing the polymer portion after providing the metal portion on the polymer portion.

Example 129 includes the subject matter of Example 125, and further specifies that the polymer portion includes an ultraviolet-active species.

Example 130 includes the subject matter of Example 125, and further specifies that providing the polymer portion on the package support includes providing a two-part polymer on the package support.

Example 131 includes the subject matter of Example 125, and further specifies that providing the polymer portion on the package support includes providing two different polymer materials.

Example 132 includes the subject matter of Example 125, and further specifies that providing the polymer portion on the package support includes providing an anhydride epoxy.

Example 133 includes the subject matter of any of Examples 125-132, and further includes: before providing the metal portion on the polymer portion, providing a thermal interface material on the die.

The invention claimed is:

1. An integrated circuit (IC) package, comprising:
a package support;
a die; and
a lid comprising a planar metal portion and a foot, wherein the die is between the package support and the planar metal portion of the lid, the foot includes a metal portion that extends from the planar metal portion towards the package support, the foot further includes a polymer portion that extends from the metal portion of the foot to the package support, all of the metal portion of the foot is further away from the package support than all of the polymer portion, and a height of the polymer portion is at least 80% of a height of the foot and is greater than 150 microns.

2. The IC package of claim 1, wherein the planar metal portion is a rectangular solid.

3. The IC package of claim 1, wherein the height of the polymer portion is between 200 microns and 1.5 millimeters.

4. The IC package of claim 1, wherein the IC package is a ball grid array package.

5. An integrated circuit (IC) package, comprising:
a package support;
a die; and
a lid comprising a metal portion and a foot between the metal portion and the package support, wherein the die is between the package support and the metal portion of the lid, the foot includes a polymer portion, all of the metal portion is further away from the package support than all of the polymer portion, and, in a cross-section along a plane perpendicular to the package support, the polymer portion has a first dimension along a first line parallel to the package support, a second dimension along a second line parallel to the package support, and a third dimension along a third line parallel to the package support, wherein the second line is between the first line and the third line, and wherein the second dimension is smaller than each of the first dimension and the third dimension.

6. The IC package of claim 5, wherein the package support includes a package substrate.

7. The IC package of claim 5, wherein the package support includes an interposer.

8. The IC package of claim 5, wherein the height of the polymer portion is greater than a thickness of the die.

9. The IC package of claim 5, wherein the height of the polymer portion is between 200 microns and 1.5 millimeters.

10. The IC package of claim 5, wherein the polymer portion may be stretched up to 300 microns without mechanical failure of the polymer portion.

11. The IC package of claim 1, wherein one end of the polymer portion is in contact with the metal portion that extends from the planar metal portion towards the package support and another end of the polymer portion is in contact with the package support.

12. The IC package of claim 2, wherein the metal portion that extends from the planar metal portion towards the package support is materially continuous with the rectangular solid of the planar metal portion.

13. The IC package of claim 1, wherein no portion of sidewalls of the polymer portion is in contact with the metal portion of the foot.

14. The IC package of claim 13, wherein no portion of the metal portion of the foot is in contact with the sidewalls of the polymer portion.

15. The IC package of claim 1, wherein no portion of the metal portion of the foot is in contact with sidewalls of the polymer portion.

16. The IC package of claim 1, wherein the package support is a package substrate.

17. The IC package of claim 1, wherein the package support is an interposer.

18. The IC package of claim 5, wherein all of the metal portion is further away from the package support than the die.

* * * * *

UNITED STATES PATENT AND TRADEMARK OFFICE
CERTIFICATE OF CORRECTION

| | | |
|---|---|---|
| PATENT NO. | : 11,935,799 B2 | Page 1 of 1 |
| APPLICATION NO. | : 16/451973 | |
| DATED | : March 19, 2024 | |
| INVENTOR(S) | : Elah Bozorg-Grayeli et al. | |

It is certified that error appears in the above-identified patent and that said Letters Patent is hereby corrected as shown below:

In the Claims

In Column 25, Claim 15, Line 15, delete "with" and insert -- with the --, therefor.

Signed and Sealed this
Thirtieth Day of April, 2024

Katherine Kelly Vidal
Director of the United States Patent and Trademark Office